United States Patent [19]

Kawaguchi et al.

[11] Patent Number: 5,487,044
[45] Date of Patent: Jan. 23, 1996

[54] SEMICONDUCTOR MEMORY DEVICE HAVING BIT LINE EQUALIZING MEANS

[75] Inventors: Takayuki Kawaguchi, Yokohama; Shigeto Mizukami, Kawasaki; Yasumitsu Nozawa; Kouji Nakao, both of Yokohama, all of Japan

[73] Assignee: Kabushiki Kaisha Toshiba, Kawasaki, Japan

[21] Appl. No.: 372,906

[22] Filed: Jan. 17, 1995

Related U.S. Application Data

[63] Continuation of Ser. No. 34,417, Mar. 19, 1993, abandoned.

[30] Foreign Application Priority Data

Mar. 19, 1992 [JP] Japan ..................... 4-063637

[51] Int. Cl.$^6$ ..................................... G11C 7/00
[52] U.S. Cl. ................. 365/203; 365/190; 365/189.01; 365/63
[58] Field of Search .......................... 365/63, 203, 204, 365/205, 207, 208, 190, 189.01

[56] References Cited

U.S. PATENT DOCUMENTS

| | | | |
|---|---|---|---|
| 4,815,040 | 3/1989 | Matsui et al. ..................... | 365/203 |
| 4,985,864 | 2/1991 | Price ................................. | 365/203 |
| 5,053,997 | 10/1991 | Miyamato et al. ............... | 365/203 |
| 5,091,889 | 2/1992 | Hamano et al. .................. | 365/203 |
| 5,093,808 | 3/1992 | Foss .................................. | 365/203 |

OTHER PUBLICATIONS

Ohtani et al, "A 25ns 1Mb CMOS SRAM", *IEEE International Solid–State Circuits Conference*, (1987).

*Primary Examiner*—David C. Nelms
*Assistant Examiner*—Vu A. Le
*Attorney, Agent, or Firm*—Foley & Lardner

[57] ABSTRACT

A semiconductor memory device having memory cells arranged in a matrix, each of the memory cells having input/output terminals, word lines for selecting the memory cells, pairs of bit lines connected to the input/output terminals, bit line pulling-up means for pulling up the potential of the bit lines, bit line loading means connected to another pair of bit lines and bit line equalizing means provided for the bit lines for equalizing the potential of the bit lines by allowing conduction between the bit lines before data is read from a selected memory cell.

38 Claims, 14 Drawing Sheets

FIG. II

SEMICONDUCTOR MEMORY DEVICE HAVING BIT LINE EQUALIZING MEANS

This application is a continuation of application Ser. No. 08/034,417, filed Mar. 19, 1993 now abandoned.

FIELD OF THE INVENTION

The present invention relates to a semiconductor memory device, and more specifically to a semiconductor memory device provided with a bit line equalization function.

BACKGROUND OF THE INVENTION

FIG. 1 is a circuit diagram showing a prior art semiconductor memory cell for a static RAM, and FIG. 11 is a circuit diagram showing a memory cell for a static RAM. In the prior art memory device, as shown in FIG. 1, a plurality of memory cells are arranged in the order of a first uppermost memory cell MC1, a second memory cell MC2, ... and a lowermost memory cell MCn. Further, word lines WL1 to WLn are connected to the memory cells MC1 to MCn, respectively to select the respective memory cell MC. Further, two bit lines BL1 and BL2 are connected to the memory cells MC1 and MC2 in common, and other two bit lines BL1R and BL2R connected to the bit lines BL1 and BL2 are connected to the memory cell MCn. In the above-mentioned connection, a bit line wire parasitic resistance R1 is inevitably present between the two bit lines BL1 and BL1R, and a bit line wire parasitic resistance R2 is inevitably present between the two bit lines BL2 and BL2R. Further, a bit line equalize transistor T5 is connected between the two bit lines BL1 and BL2. A pulse φEQ is inputted to the gate of this transistor T5. A bit line pull-up transistor T3 having a gate to which a pulse φEQ is inputted is connected to the bit line BL1. Another bit line pull-up transistor T4 having a gate to which a pulse φEQ is also inputted is connected to the bit line BL2. In addition, bit line load transistors T1 and T2 are connected to the bit lines BL1 and BL2, respectively. On the other hand, the bit line BL1R is connected to an input/output line IO1 via a column switch transistor T6, and the bit line BL2R is connected to another input/output line IO2 via a column switch transistor T7. Two gates of the column transistors T6 and T7 are connected to a column select signal line CL1. Therefore, bit line wire parasitic capacitances C11 and C21 are inevitably present between the bit lines BL1 and BL2 and ground, respectively and bit line wire parasitic capacitances C12 and C22 are inevitably present between the bit lines BL1R and BL2R and ground, respectively.

In the circuit configuration as described above, the pulse φEQ inputted to the gates of the bit line pull-up transistors T3 and T4 and the bit line equalize transistor T5 is a one-shot pulse given at an address transition or at a data write end in order to turn on momentarily the bit line pull-up transistors T3 and T4 and the bit line equalize transistor T5, respectively. When turned on, the bit line pull-up transistors T3 and T4 initialize voltage or potential of the bit lines BL1, BL2, BL1R and BL2R by pulling up the voltage of the bit lines BL1, BL2, BL1R and BL2R at the address transition or at the data write end. Further, the bit line load transistors T1 and T2 serve to prevent a low-level voltage of the bit lines BL1, BL2, BL1R and BL2R from being dropped excessively at the data read operation and additionally to initialize the bit line voltage at the address transition or at the write end, in the same way as with the case of the pull-up transistors T3 and T4. On the other hand, the bit line equalize transistor T5 initializes the bit line voltage in such a way that the bit lines BL1 and BL2 are connected to each other momentarily at the address transition or at the write end to transfer an electric charge from the high level side to and the low level side between the bit lines BL1, BL2 and BL1R, BL2R, respectively (i.e., the voltage amplitude between a pair of the bit lines are reduced momentarily), so that the bit line voltages can be inverted at high speed at the data read operation.

Here, the assumption is made as follows: when the memory cell MC1 is selected in the write status, a high level voltage is applied to the bit lines BL1 and BL1R and a low level voltage is applied to the bit line BL2 and BL2R so that a data "0" is written to the memory cell MC1. In this status, when the write status changes to the read status and an address changes so that the memory cell MC1 becomes a non-selected status and the memory cell MCn is selected, an information recorded in the memory cell MCn is outputted with the bit lines BL1 and BL1R set at the low level and with the bit lines BL2 and BL2R set at the high level. Here, the transistors T1 to T5 are all NMOS transistors. FIG. 3 is a waveform diagram showing change in voltage level on the bit lines BL1, BL2, BL1R and BL2R, respectively in the above-mentioned conditions.

When the write status changes to the read status under the condition that a supply voltage Vcc is applied to the word line WL1 and thereby the memory cell MC1 is selected, the one-shot pulse φEQ the same in level as the supply voltage Vcc is generated to turn on the bit line pull-up transistors T3 and T4 and the bit line equalize transistor T5. At this time, the bit line BL1 at the high level and the bit line BL2 at the low level are equalized through the bit line equalize transistor T5, so that an electric charge transfers from the high level side to the low level side to drop the high level on the bit line BL1 to the low level and to raise the low level on the bit line BL2 to the high level. At the same time as the equalization, the bit lines BL1 and BL2 are pulled up to a voltage (supply voltage Vcc—threshold voltage $V_{THN}$) by the bit line load transistors T1 and T2 and the bit line pull-up transistors T3 and T4. On the other hand, the bit lines BL1R and BL2R follow the bit lines BL1 and BL2 (the voltage level changes in the same way). The follow-up characteristics are determined by a time constant of the bit line wire resistance and the bit line wire capacitance. Therefore, the follow-up speed increases with decreasing product of both. In other words, the bit line time constant decreases and thereby the follow-up characteristics is improved with decreasing bit line wire parasitic resistances R1 and R2 and the bit line wire parasitic capacitances C1 and C2. Further, when the word line WL1 changes to the low level and the word line WLn is activated, the memory cell MCn is selected instead of memory cell MC1. As a result, a data stored in the memory cell MCn is transmitted to the bit lines BL1R and BL2R, so that the data access to the memory cell MCn is made and thereby the levels on the respective bit lines BL1, BL2, BL1R and BL2R are all determined.

Conventionally, the bit line equalize transistor T5, the bit line load transistors T1 and T2 and the bit line pull-up transistors T3 and T4 of three different functions are all arranged as shown in FIG. 1 from the standpoint of an easiness in layout. In practice, all the transistors of three functions are arranged together on the uppermost side (on the side of the memory cell MC1) or the lowermost side (on the side of the memory cell MCn) of the bit lines BL1, BL2, BL1R and BL2R and connected to the bit lines. As a result, a pull-up current Ipu and an equalize current Ieq flow through the bit lines BL1, BL2, BL1R and BL2R by way of routes as shown in FIG. 4, during all the above-mentioned data write and read operation. In more detail, in FIG. 4, the equalize current Ieq flows from the bit line wire parasitic capacitances C12 and C11 to the bit line wire parasitic capacitances C21 and C22 through the bit line BL1R, the bit line wire parasitic resistance R1, the bit line BL1 and the bit line equalize transistor T5, the bit line BL2, the bit line wire parasitic resistance R2 and the bit line BL2R, Therefore, the electric charge on the bit lines BL1 and BL1R is discharged and that on the bit lines BL2 and BL2R is charged. On the other hand, the pull-up current Iup flows from the bit line pull-up transistor T3 and the bit line load transistor T1 to the bit line BL2, the bit line wire parasitic resistance R2 and the bit line BL2R through the bit line BL1, the bit line wire parasitic resistance R1, the bit line BL1R and the bit line equalize transistor T5. Therefore, the bit line wire parasitic capacitances C11, C12, C21 and C22 are charged. On the other hand, the pull-up current Ipu flows from the bit line pull-up transistor T4 and the bit line load transistor T2 to the bit line BL2, the bit line wire parasitic resistance R2 and the bit line BL2. Therefore, the bit line wire parasitic capacitances C21 and C22 are both charged.

Recently, with increasing memory capacity of the memory integrated circuit device, the number n of the memory cells arranged in the bit line direction increases in proportion thereto. FIG. 5 shows a memory cell array configuration of a 4 Mbit SRAM. In each memory cell array, a bit line precharge section BLPC, a bit line equalize section BLEQ, a bit line load section BLL and the memory cell section are arranged in sequence, and further a column switch section CSW, a sense amplifier section SA and a data bus section DB are connected in sequence under the memory cell section MC. A row of the memory cell section MC is selected by a row decoder section RD. The memory cell section MC is composed of cells having 128×32 sections in column and 1 k cells in row.

With the advance of the larger memory capacitance, the number of the memory cells arranged in the bit line direction has increased more and more recently, with the result that it has become impossible to disregard the influence of the bit line wire parasitic resistances R1 and R2 and the bit line wire parasitic capacitances C11 to C22 (so far disregarded) upon the operation of the bit lines BL1, BL2, BL1R and BL2R.

FIG. 3 is a waveform diagram for assistance in explaining the above-mentioned influence. When the write status changes to the read status under the condition that the supply voltage Vcc is applied to the word line WL1 and thereby the memory cell MC1 is selected, the one-shot pulse φEQ of supply voltage Vcc is generated and applied to the gates of the bit line pull-up transistors T3 and T4 and the bit line equalize transistor T5, so that these transistors are all turned on. At this time, the bit line BL1 at the high level and the bit line BL2 at the low level are equalized in potential level by the bit line equalize transistor T5. Accordingly, an electric charge transfers from the high level side to the low level side, so the bit line BL1 drops from the high level to the low level, and the bit line BL2 rises from the row level to the high level. Upon equalization, the bit lines BL1 and BL2 are pulled up in level to the voltage (supply voltage Vcc— threshold voltage $V_{THN}$) by the bit line load transistors T1 and T2 and the bit line pull-up transistors T3 and T4. On the other hand, the potential of the bit lines BL1R and BL2R follows that of the bit lines BL1 and BL2, respectively. In this case, however, when the selection status of the memory cell MC1 changes to that of the memory cell MCn arranged farthest away from the memory cell MC1 now being selected, since the bit line wire parasitic resistances R1 and R2 and the bit line wire parasitic capacitances C11, C21, C12 and C22 are large, the follow-up characteristics from the bit lines BL1R and BL2R to the bit lines BL1 and BL2 are slow in operation. This is because the bit line load transistors T1 and T2, the bit line pull-up transistors T3 and T4 and the bit line equalize transistor T5 are all arranged on the uppermost side of the bit lines BL1, BL2, BL1R and BL2R, so that the bit line wire parasitic resistances R1 and R2 and the bit line wire parasitic capacitances C11 to C22 corresponding to 1000 cells arranged between the uppermost position and the memory cell MCn are inevitably produced to the bit lines. On the other hand, in the write status, the amplitudes of the bit lines BL1, BL2, BL1R and BL2R are all large. Accordingly, it is impossible to sufficiently pull up or equalize the potential of the bit lines BL1R and BL2R, thus causing a problem in that the delay time at the bit line inversion becomes serious whenever the write status changes to the read status.

In addition, since the bit line load transistors T1 and T2 are connected to the uppermost position of the bit lines as shown in FIG. 1, when the bit line wire parasitic resistances R1 and R2 increase, there exists another problem in that the low level on the bit lines BL1, BL2, BL1R and BL2R rises in the data write operation. The data write operation can be achieved by turning on the column switch transistors T6 and T7 selected by the column decoder through a writing driver so that either one of a pair of the bit lines changes to the low level. Accordingly, at points far away from the writing driver on the bit lines, the low level of the bit lines at the data write operation rises by the current flowing through the bit line wire parasitic resistances R1 and R2 from the bit line load transistors T1 and T2. This voltage rise in the low level develops high, in particular at the junction point between the memory cell MC1 arranged near the bit line load transistors T1 and T2 and the bit lines BL1 and BL2.

As described above, in the prior art semiconductor memory device, there exists a problem in that the read/write reliability is deteriorated when the memory capacity increases, and further made high speed operation is difficult.

SUMMARY OF THE INVENTION

With these problems in mind, therefore, the object of the present invention is to provide a high performance semiconductor memory device which can initialize the bit line voltage at high speed and further improve the data write reliability.

In the semiconductor memory device according to the present invention, the bit line equalizing means is arranged at a predetermined position along the bit line column direction, so that the bit lines can be equalized at high speed. Further, pull-up means is provided at one end of the bit lines and bit line load means is provided at the other end of the bit lines. Consequently, the potential rise at the low level bit lines at the data write operation can be suppressed effectively, and additionally the potential on the bit lines is raised at high speed from both the ends of the bit lines by the pull-up current.

According to the present invention, the potential of a pair of the bit lines can be equalized and pulled up at high speed, and further the potential rise in the low level of the bit lines can be suppressed in the data write operation.

DETAILED DESCRIPTION OF THE PREFERRED EMBODIMENTS

Embodiments of the present invention will be described hereinbelow with reference to the attached drawings.

Figure 1:
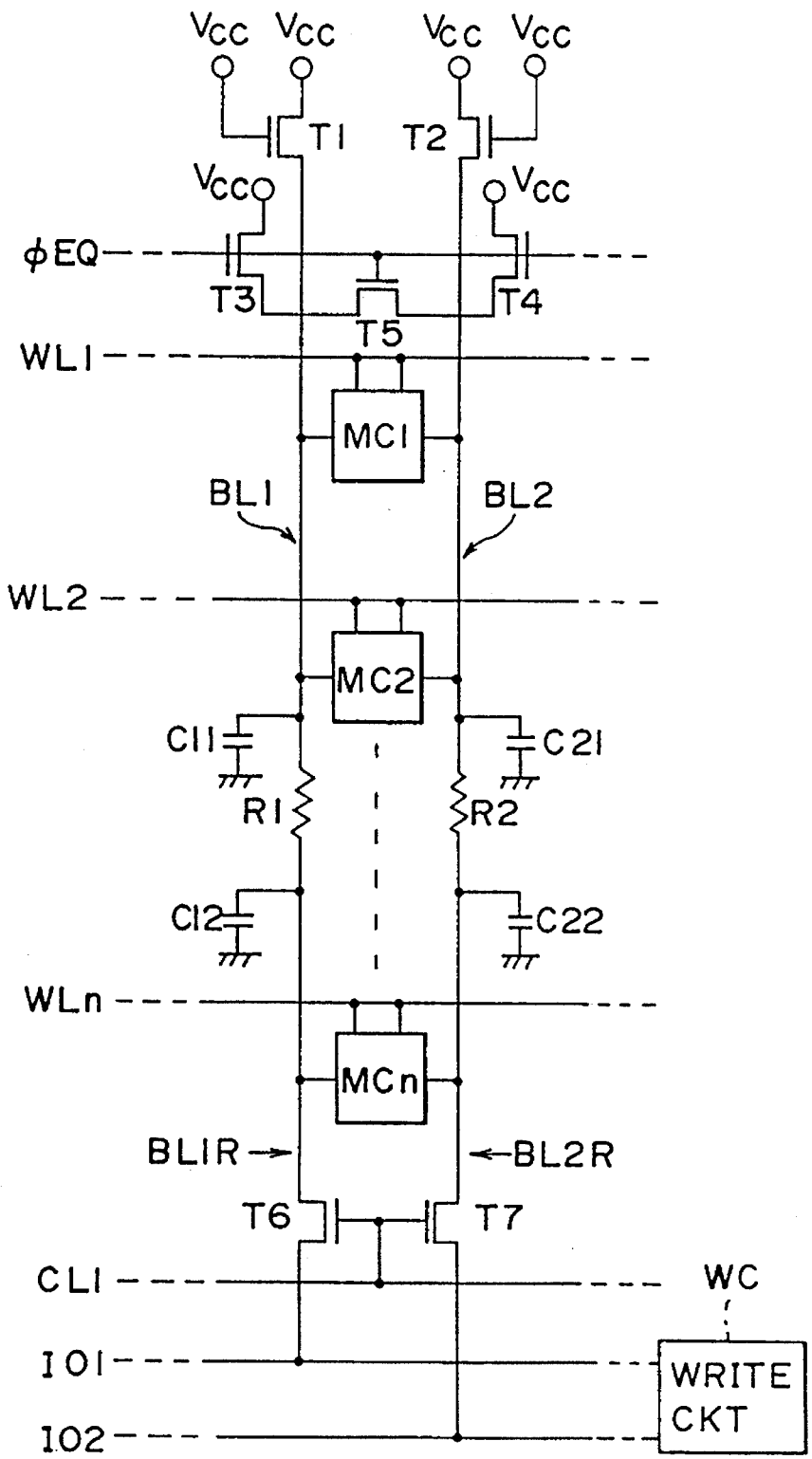
FIG. 1 is a circuit diagram showing a prior art semiconductor memory device.
Figure 2:
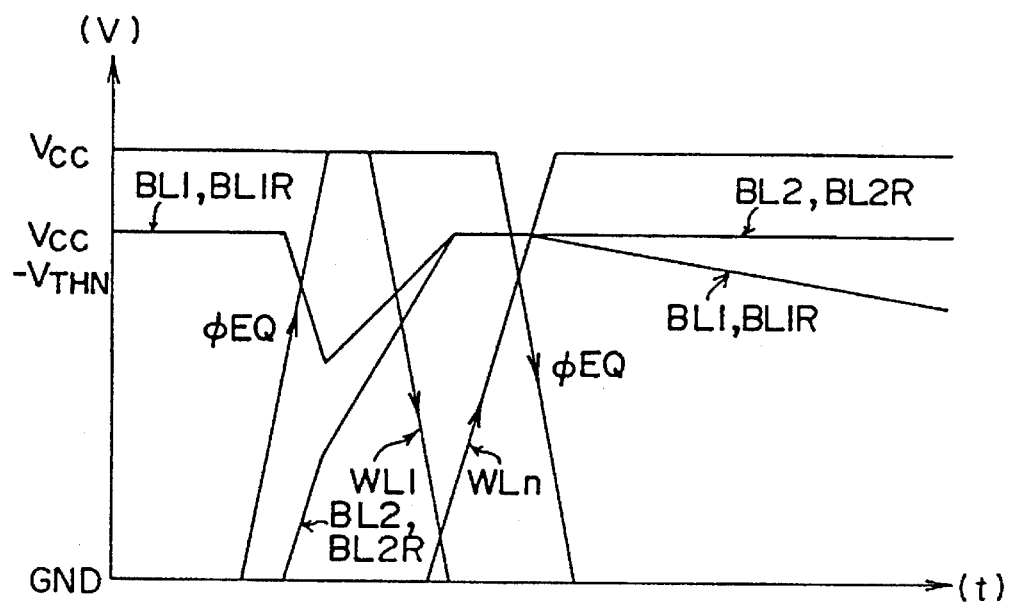
FIG. 2 is a waveform diagram for assistance in explaining the operation of the prior art memory device shown in FIG. 1.
Figure 3:
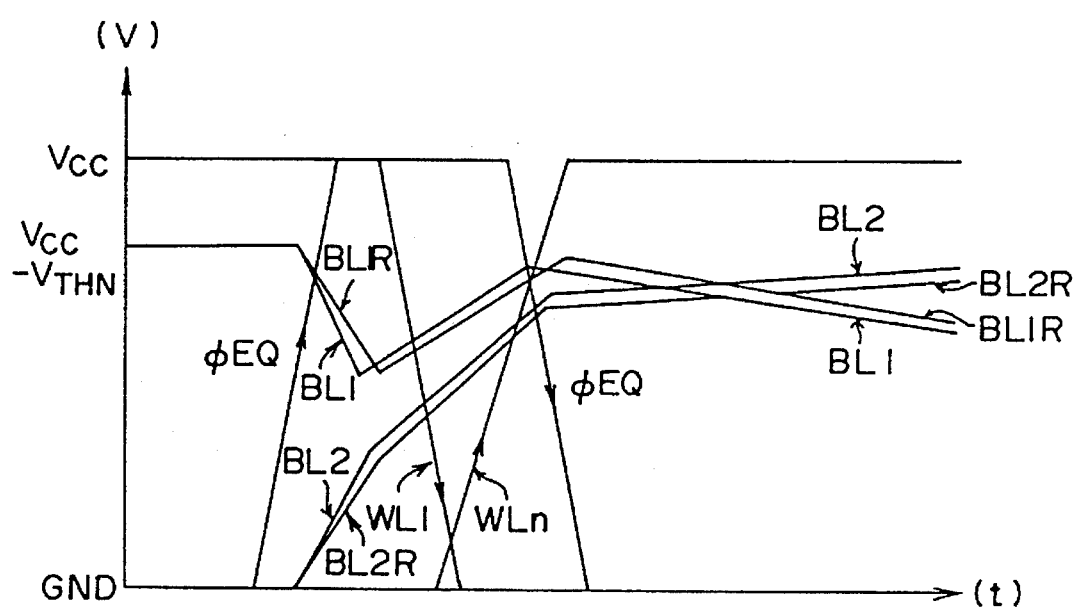
FIG. 3 is a waveform diagram for assistance in explaining the other operation of the prior art memory device shown in FIG. 1.
Figure 4:
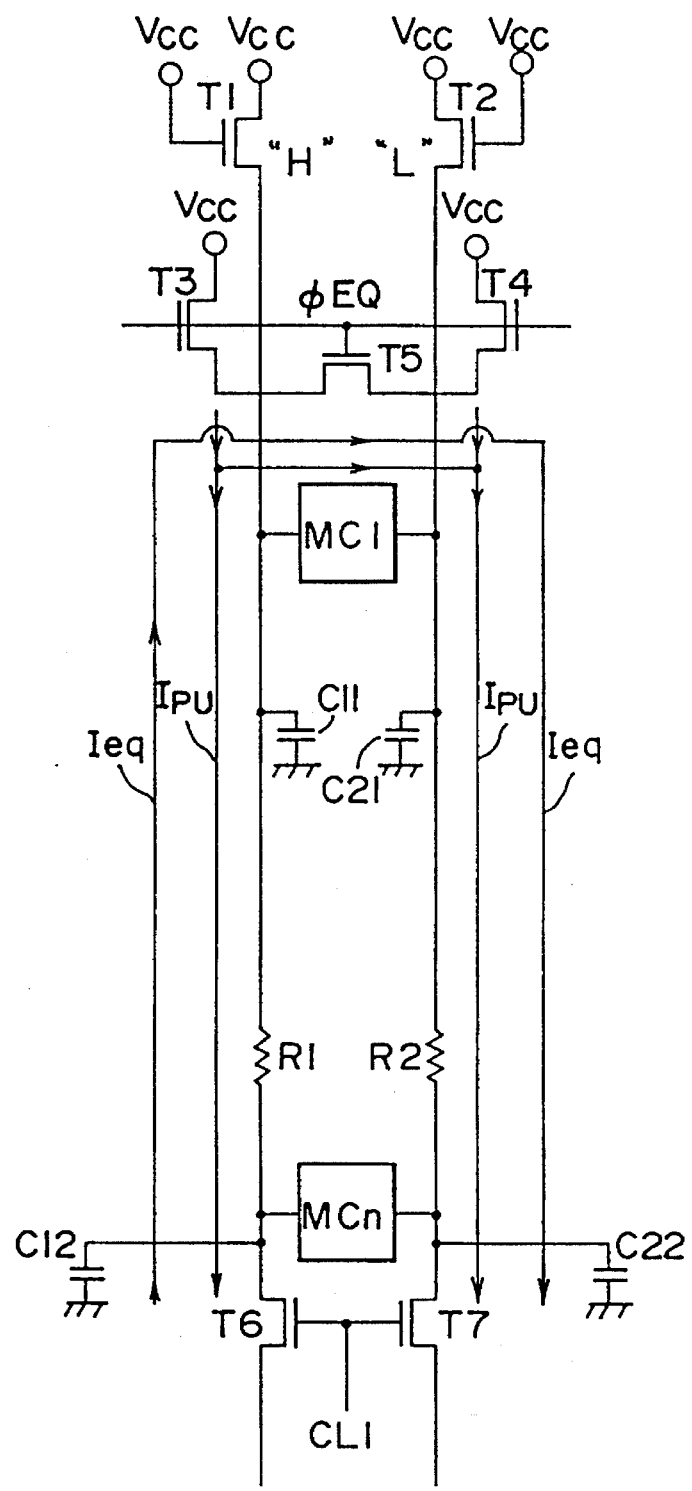
FIG. 4 is a circuit diagram for assistance in explaining the current flow routes of the prior art memory device shown in FIG. 1.
Figure 5:
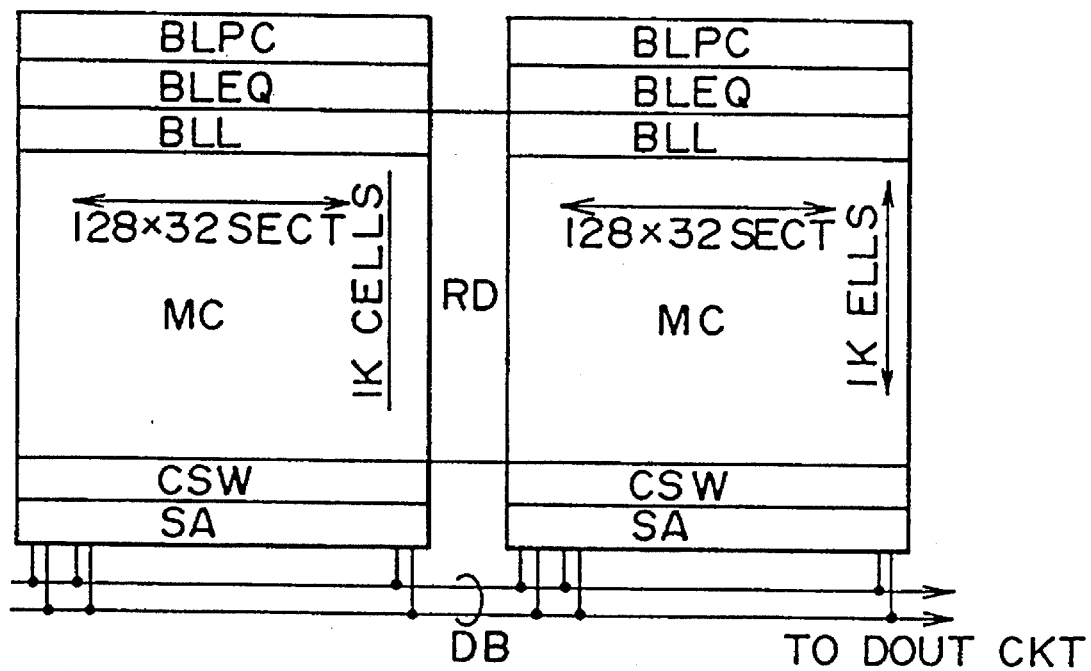
FIG. 5 is a block diagram showing an exemplary memory cell array of 4 Mbit SRAM.
Figure 6:
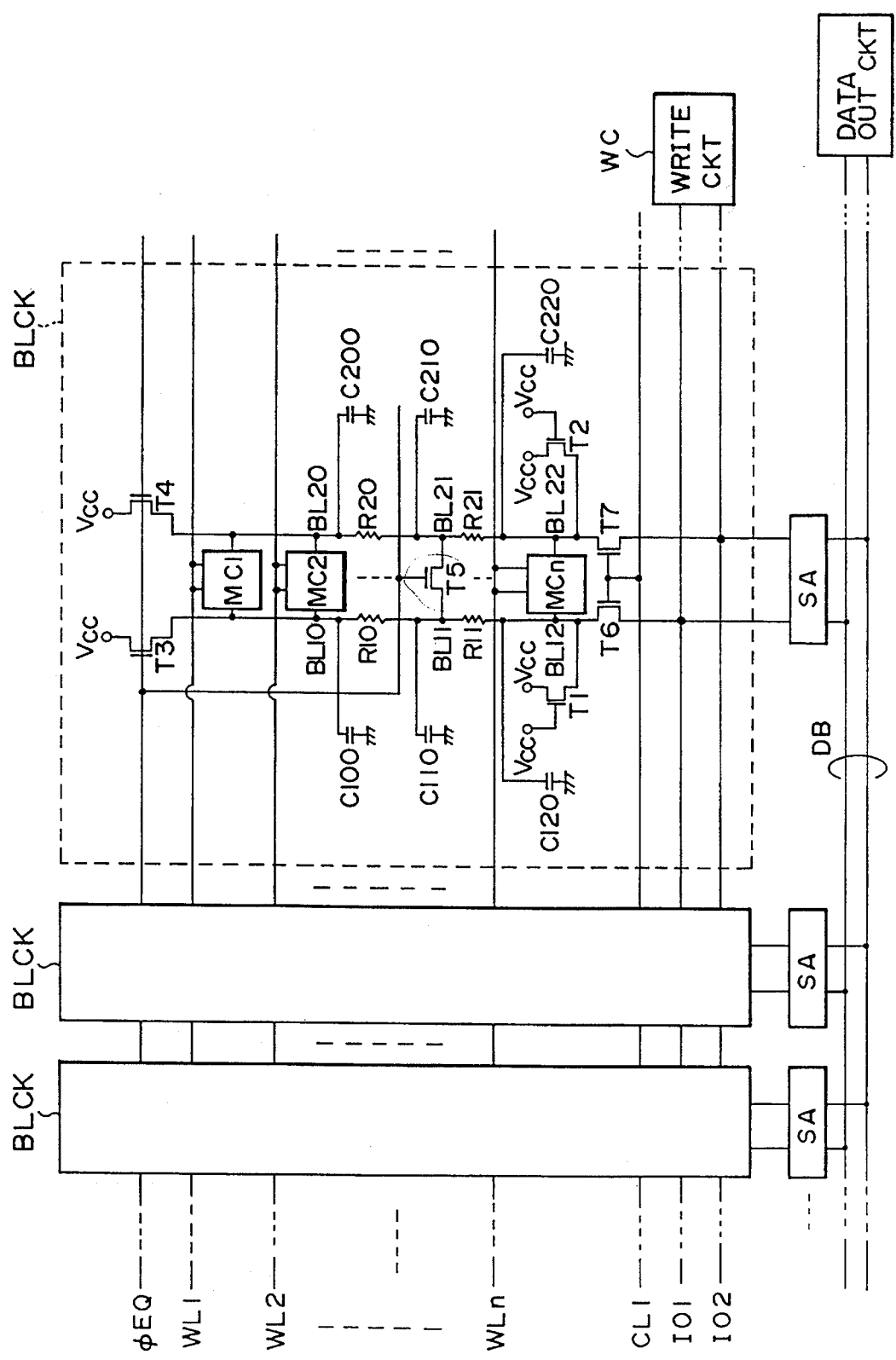
FIG. 6 is a circuit diagram showing a first embodiment of the semiconductor memory device according to the present invention.
Figure 11:
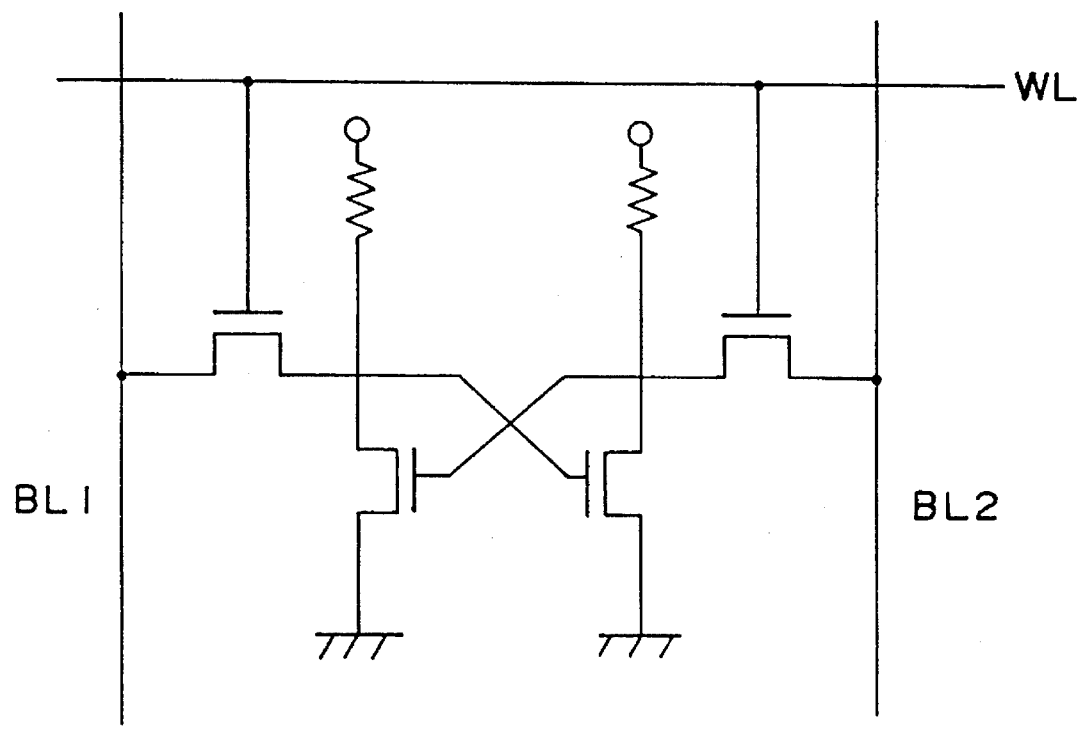
FIG. 11 is a circuit diagram showing an exemplary memory cell of a static RAM.
Figure 12:
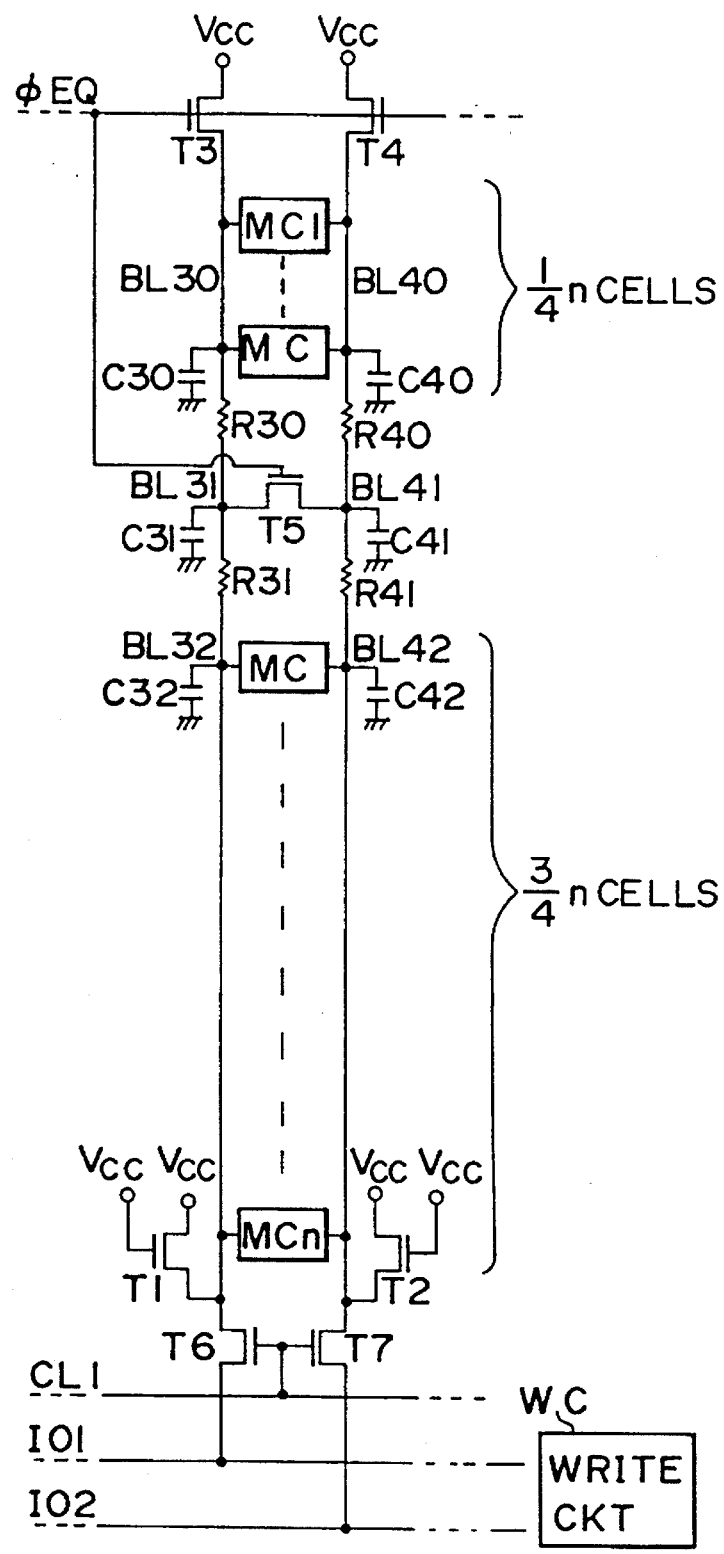
FIG. 12 is a circuit diagram showing a fourth embodiment of the semiconductor memory device according to the present invention.
Figure 13:
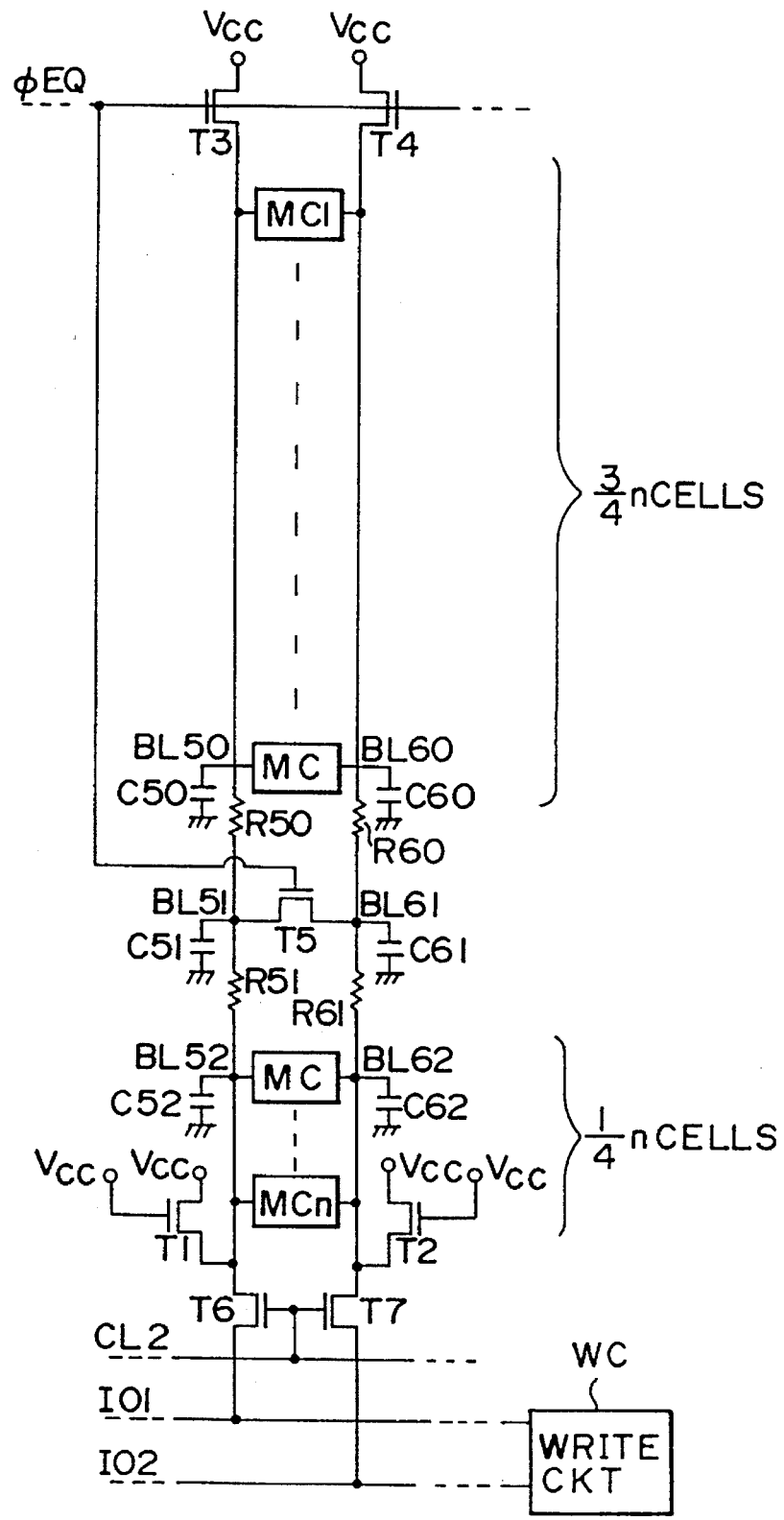
FIG. 13 is a circuit diagram showing a fifth embodiment of the semiconductor memory device according to the present invention.
Figure 14:
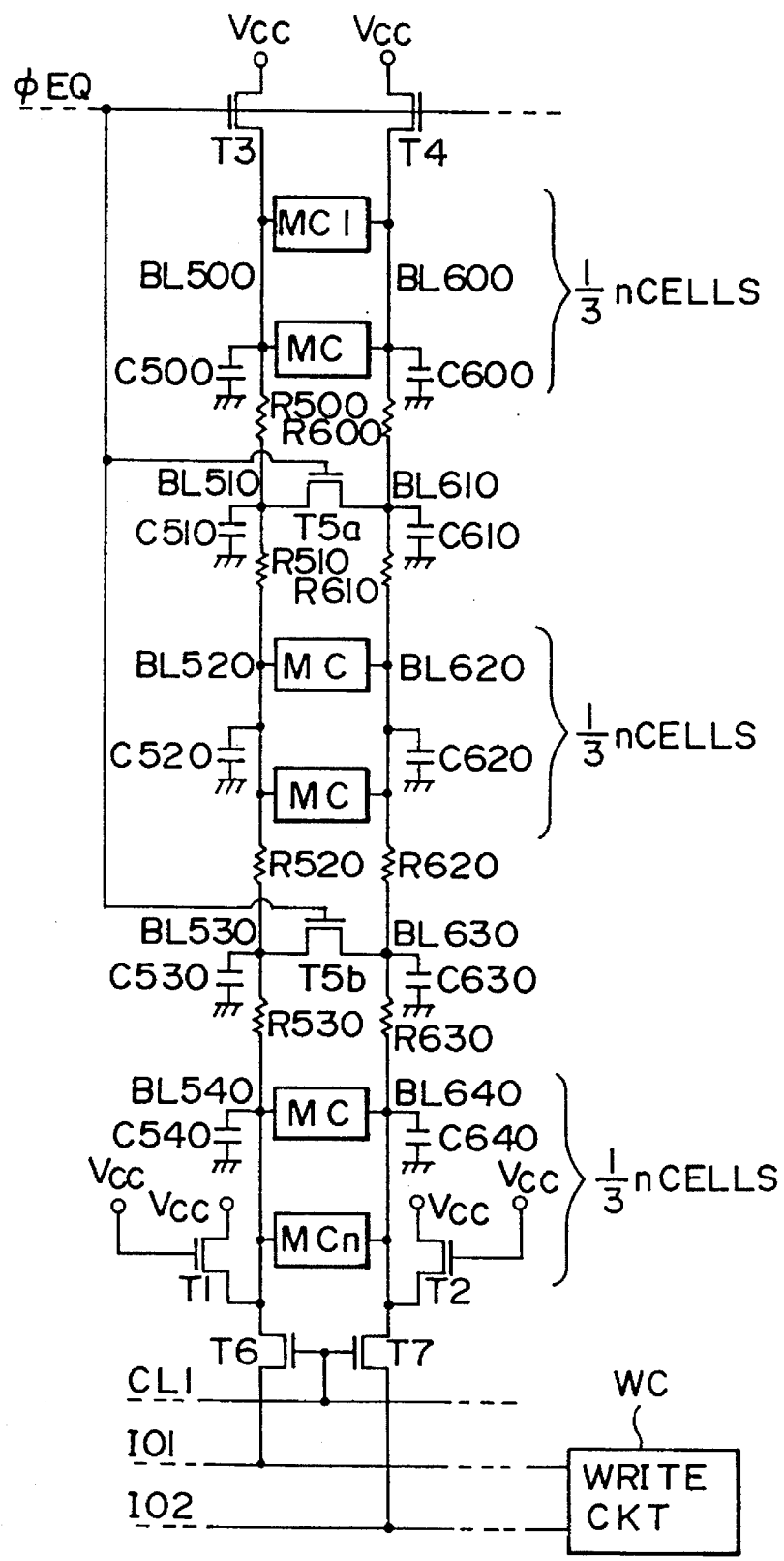
FIG. 14 is a circuit diagram showing a sixth embodiment of the semiconductor memory device according to the present invention.
Figure 15:
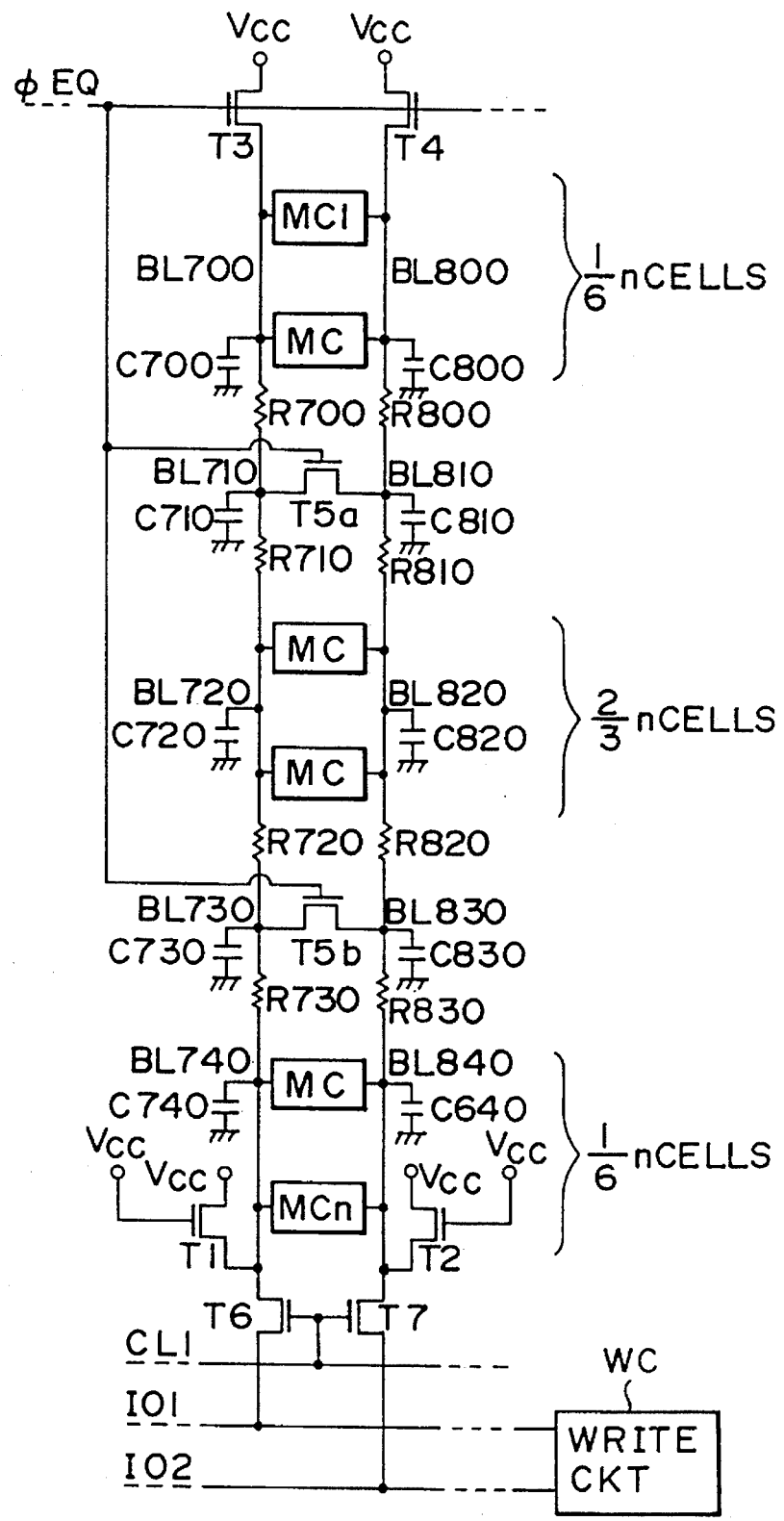
FIG. 15 is a circuit diagram showing a seventh embodiment of the semiconductor memory device according to the present invention.

FIG. 6 shows a first embodiment of the semiconductor memory device (SRAM) according to the present invention, in which a plurality of blocks are incorporated and each memory cell CM is configured as shown in FIG. 11, for instance. In FIG. 6, an uppermost memory cell MC1 and the succeeding memory cell MC2 are arranged along two bit lines BL10 and BL20 both connected to bit line pull-up transistors T3 and T4, respectively. A lowermost memory cell MCn is arranged along two bit lines BL12 and BL22 both connected to column switch transistors T6 and T7, respectively. On the other hand, a bit line equalize transistor T5 is connected between two bit lines BL11 and BL21 positioned at roughly a middle portion between the uppermost memory cell CM1 and the lowermost memory cell CMn. A bit line wire parasitic resistance R10 lies between the bit lines BL10 and BL11. A bit line wire parasitic resistance R11 lies between the bit lines BL11 and BL12. A bit line wire parasitic resistance R20 lies between the bit lines BL20 and BL21. A bit line wire parasitic resistance R21 lies between the bit lines BL21 and BL22. Two bit line load transistors T1 and T2 are connected to a part of the bit lines BL12 and BL22 near the column switch transistors T6 and T7, respectively. Bit line wire parasitic capacitances C100, C110 and C120 are present at the bit line BL11. Bit line wire parasitic capacitances C200, C210 and C220 are present at the bit line BL21. As described above, the first and second bit line systems are formed. In other words, the first bit line system is formed by the bit line pull-up transistor T3, the bit line BL10, the bit line wire parasitic resistance R10, the bit line BL11, the bit line wire parasitic resistance R11 and the bit line BL12. Further, the second bit line system is formed by the bit line pull-up transistor T4, the bit line BL20, the bit line wire parasitic resistance R20, the bit line BL21, the bit line wire parasitic resistance R21 and the bit line BL22. The bit line equalize transistor T5 is connected to the bit lines BL11 and BL21 corresponding to roughly the middle portion of these two systems in such a way that the number of the memory cells arranged on the upper side of the bit line equalize transistor T5 is roughly equal to the number of the memory cells arranged on the lower side of the bit line equalize transistor T5. As a result, it is possible to reduce roughly half the magnitudes of the bit line wire parasitic resistances R10 and R20 and of the bit line wire parasitic capacitances C100 and C200 existing on the side of the bit lines BL10 and BL20 above the bit line equalize transistor T5 and also the magnitudes of the bit line wire parasitic resistances R11 and R21 and of the bit line wire parasitic capacitances C120 and C200 existing on the side of the bit lines BL12 and BL22 below the bit line equalize transistor T5, as compared with those of the prior art configuration as shown in FIG. 1 in the bit line equalization operation. Further, in FIG. 6, a writing circuit WC for outputting data to write data in the memory cells MC(i) is shown.

In the above-mentioned configuration, the bit line load transistors T1 and T2 are connected to the bit lines at the junction point of the memory cell MCn arranged nearest to an input/output lines IO1 and IO2. Consequently, it is possible to suppress a voltage rise in the low level on the bit lines BL10 and BL20 located farthest away from the bit line load transistors T1 and T2 at the data write operation. In contrast with this, the bit line pull-up transistors T3 and T4 are connected to the bit lines BL10 and BL20 farthest away from the bit line load transistors T1 and T2. Consequently, when the pulse φEQ changes to a high level for one shot, it is possible to flow the bit line pull-up current from both the upper and lower sides. In addition, it is possible to reduce the bit line wire parasitic resistances R10 and R20 on the side of the bit lines BL10 and BL20 and the bit line wire parasitic resistors R11 and R22 on the side of the bit lines BL12 and BL22, so that bit line equalization can be effected reliably at high speed.

The pulse φEQ inputted to the gates of the bit line pull-up transistors T3 and T4 and the bit line equalize transistor T5 is given as a one-shot pulse at the address transition or the data write end, to turn momentarily on the bit line pull-up transistors T3 and T4 and the bit line equalize transistor T5. The bit line pull-up transistors T3 and T4 initialize the potential on the bit lines BL10, BL11, BL12, BL20, BL21 and BL22 by pulling up the voltage of the bit lines BL10, BL11, BL12, BL20, BL21 and BL22 at the address transition or the data write end. Further, the bit line load transistors T1 and T2 serve to prevent the low level voltage of the bit lines BL10, BL11, BL12, BL20, BL21 and BL22 from being dropped excessively at the data reading operation and in addition to initialize the bit line voltage at the address transition or at the data write end in the same way as with the case of the pull-up transistors T3 and T4. On the other hand, the bit line equalize transistor T5 connects a pair of the bit lines BL10, BL11, BL12 and bit lines BL20, BL21, BL22 momentarily at the address transition or the data write end. Accordingly, electric charge is transferred between a pair of the bit lines BL10, BL11, BL12 and bit lines BL20, BL21, BL22 from the high level side to the low level side to momentarily reduce the difference in potential amplitude between a pair of the bit lines for bit line initialization. Therefore, it is possible to inverse the bit line potential at high speed at the data read operation.

Figure 7:
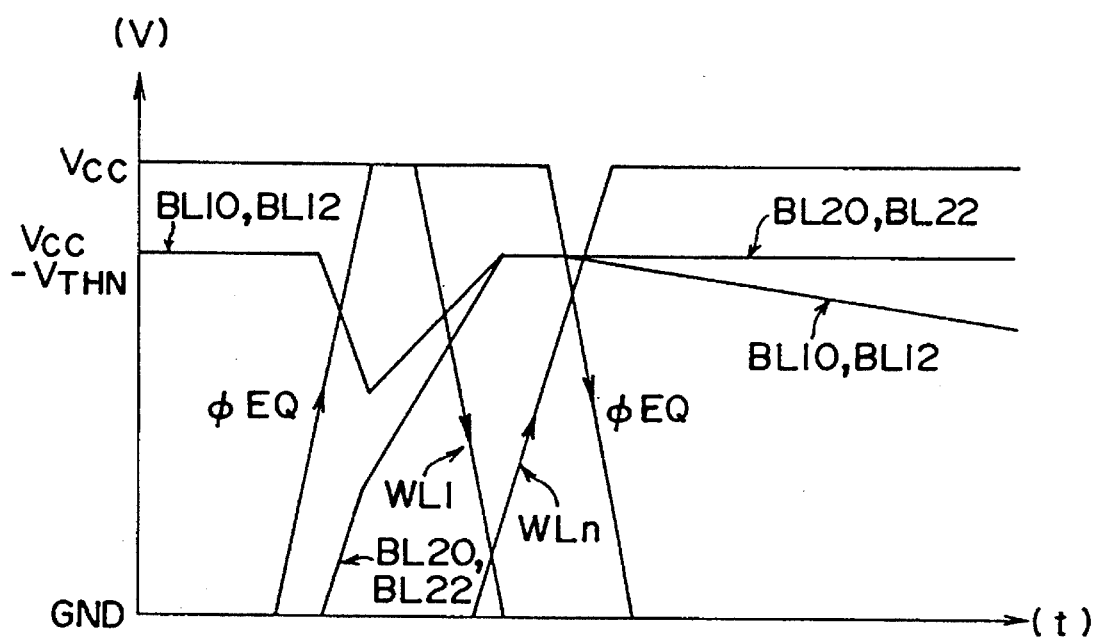
FIG. 7 is a waveform diagram for assistance in explaining the operation of the device shown in FIG. 6.

Here, the assumption is made as follows: the memory cell MC1 is selected at the data write status. At this time, a high level voltage is applied to the bit lines BL10, BL11 and BL22 and a low level voltage is applied to the bit lines BL20, BL21 and BL22, and further a data "0" is written in the memory cell MC1. Further, the write status changes to the read status and further the memory cell MC1 changes to a non-selected condition and an address for selecting memory cell MCn is designated. Here, the information stored in the memory cell MCn is such that the low level is outputted on the bit lines BL10, BL11 and BL12 and the high level is outputted on the bit lines BL20, BL21 and BL22. Under these conditions, the potential waveforms of the respective bit lines BL10, BL11, BL12, BL20, BL21 and BL22 change as shown in FIG. 7.

Under the conditions such that the word line WL1 is at the supply voltage Vcc and the memory cell MC1 is selected, when the write status changes to the read status, a one-shot pulse φEq whose level is the same as the supply voltage Vcc is generated. As a result, since this pulse φEq is applied to the gates of the bit line pull-up transistors T3 and T4 and the bit line equalize transistor T5, these transistors are all turned on. At this time, the bit lines BL10, BL11 and BL12 of the high level and the bit lines BL20, BL21 and BL22 of the low level are all equalized by the bit line equalize transistor T5. Therefore, electric charge transfers from the high level side to the low level side, so that the bit lines BL10, BL11 and BL12 at the high level drops in level and the bit lines BL20, BL21 and BL22 at the low level rises in level. Upon equalization, the bit lines BL10, BL11 and BL12, BL20, BL21 and BL22 are all pulled up in level to a value (the supply voltage Vcc—the threshold voltage $V_{THN}$) by the bit line load transistors T1 and T2 and the bit line pull-up transistors T3 and T4. Here, when the word line WL1 changes to the low level and word line WLn is activated, the memory cell MCn is selected in place of the memory cell MC1. As a result, the data stored in the memory cell MCn is transmitted to the bit lines BL12 and BL22; that is, an access to the memory cell MCn is achieved so that the levels of the bit lines BL10, BL11 and BL12, BL20, BL21 and BL22 are all determined.

Figure 8:
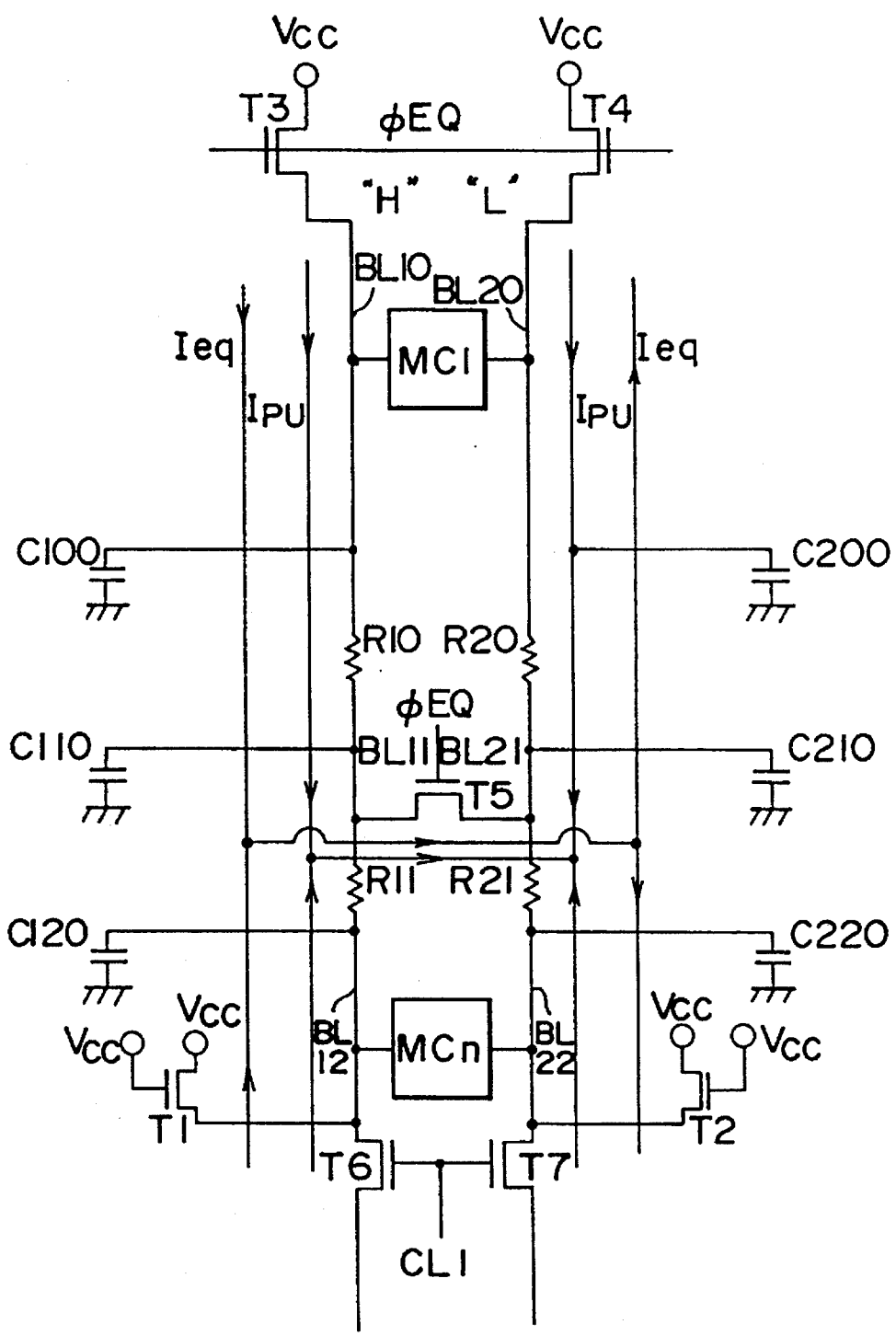
FIG. 8 is a circuit diagram for assistance in explaining the current flow routes of the memory device shown in FIG. 6.

The bit line equalize transistor T5, the bit line load transistors T1 and T2 and the bit line pull-up transistors T3 and T4 are all arranged as shown in FIG. 6. Therefore, a pull-up current Ipu and an equalize current Ieq flow through the bit lines BL10, BL11 and BL12, BL20, BL21 and BL22 as shown in FIG. 8 during the above-mentioned operation. In more detail, as shown in FIG. 8, there exist a fifth route such that the equalize current Ieq flows from the bit line wire parasitic capacitances C100 and C110 to the bit line BL21 through the bit line BL10, the bit line wire parasitic resistance R10, the bit line BL11 and the bit line equalize transistor T5; a sixth route such that the equalize current Ieq flows from the bit line wire parasitic capacitances C120 and C110 to the bit line BL21 through the bit line BL12, the bit line wire parasitic resistance R11, the bit line BL11 and the bit line equalize transistor T5; a seventh route such that after the sixth route, the equalize current Ieq further flows from the bit line BL21 to the bit line wire parasitic capacitances C210 and C200 through the bit line wire parasitic resistance R20 and the bit line BL20; and an eighth route such that the equalize current Ieq further flows from the bit line BL21 to the bit line wire parasitic capacitances C210 and C220 through the bit line wire parasitic resistance R21 and the bit line BL22. Through these routes, the bit lines BL20, BL21 and BL22 are discharged and the bit lines BL20, BL21 and BL22 are charged. On the other hand, there exist a first route such that the pull-up current Ipu flows from the bit line pull-up transistor T3 to the bit line equalize transistor T5 through the bit line BL10, the bit line wire parasitic resistance R10, and the bit line BL11; a second route such that the pull-up current Ipu flows from the bit line load transistor T1 to the bit line equalize transistor T5 through the bit line BL12, the bit line wire parasitic resistance R11, and the bit line BL11; a third route such that the pull-up current Ipu flows from the bit line pull-up transistor T4 to the bit line equalize transistor T5 through the bit line BL20, the bit line wire parasitic resistance R20, and the bit line BL21; and a fourth route such that the pull-up current Ipu flows from the bit line load transistor T2 to the bit line equalize transistor T5 through the bit line BL22, the bit line wire parasitic resistance R21, and the bit line BL21. Therefore, the bit line wire parasitic capacitances C100, C110, C120, C210 and C220 are all charged.

Further, any conductive type transistors of PMOS or NMOS or both can be used as the transistors T1 to T7. FIG. 11 shows an exemplary configuration of the memory cell MC (i). For the memory cell MC (i), it is also possible to use a read only cell.

In the above-mentioned first embodiment, the equalize transistor T5 is connected to the bit lines BL11 and BL21 at roughly a half arrangement position of the memory cells MC1 to MCn. Without being limited only to the half arrangement position, it is possible to connect the bit lines at any given arrangement positions of the memory cells such as ⅓, ⅔, ¼, ¾, etc.

Figure 9:
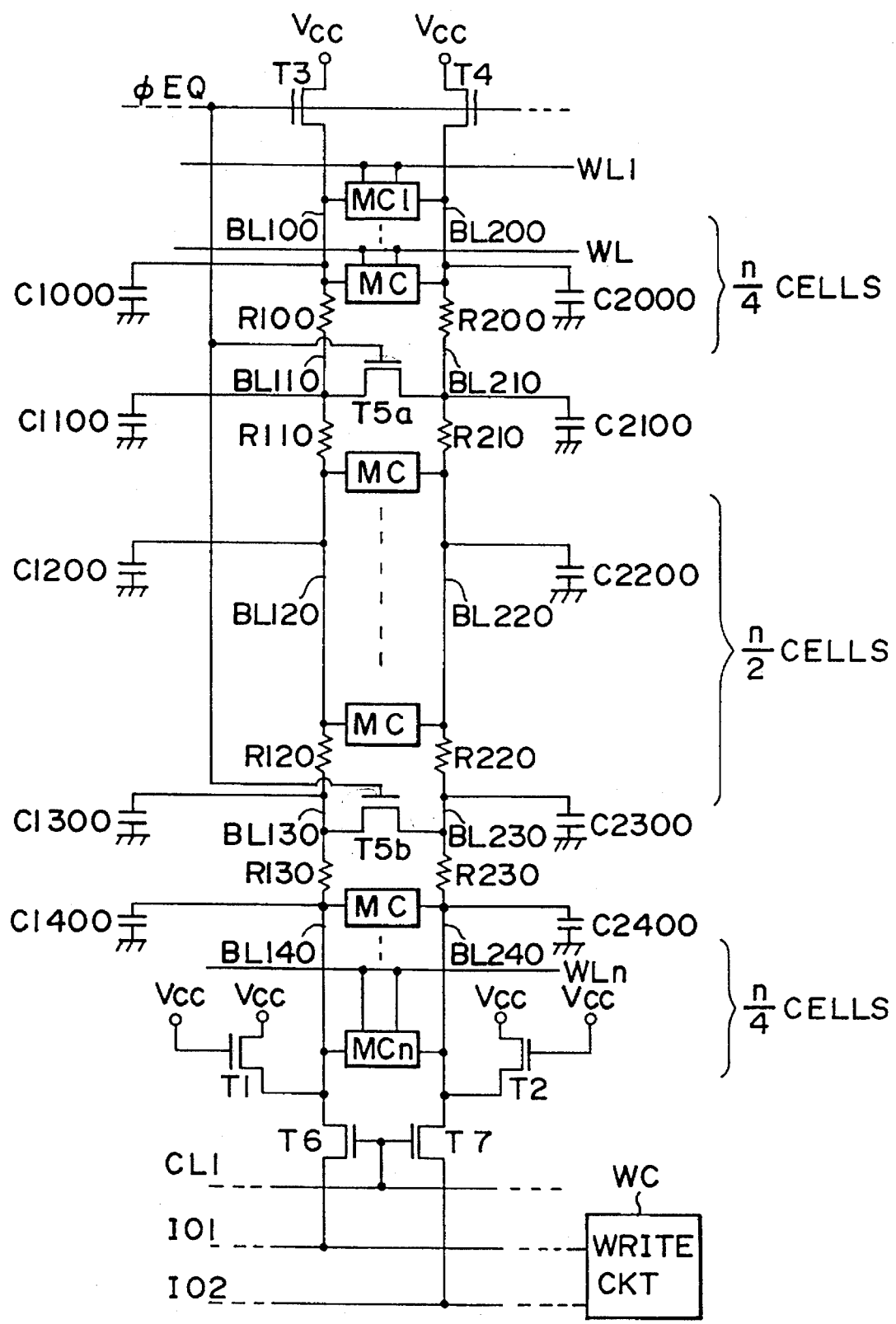
FIG. 9 is a circuit diagram showing a second embodiment of the semiconductor memory device according to the present invention.

A second embodiment of the present invention will be described hereinbelow with reference to FIG. 9. In FIG. 9, two bit line equalize transistors T5a and T5b are arranged and connected to the bit lines at two different positions. The equalize transistor T5a is connected to a position roughly one-fourth of a plurality of the memory cells arranged in the column direction, and the equalize transistor T5b is connected to a position roughly three-fourth of a plurality of the memory cells arranged in the column direction. In this embodiment, the magnitudes of the bit line resistances and the capacitances substantially connected to the equalize transistors T5a and T5b are about one-fourth of those of the prior art configuration.

Figure 10:
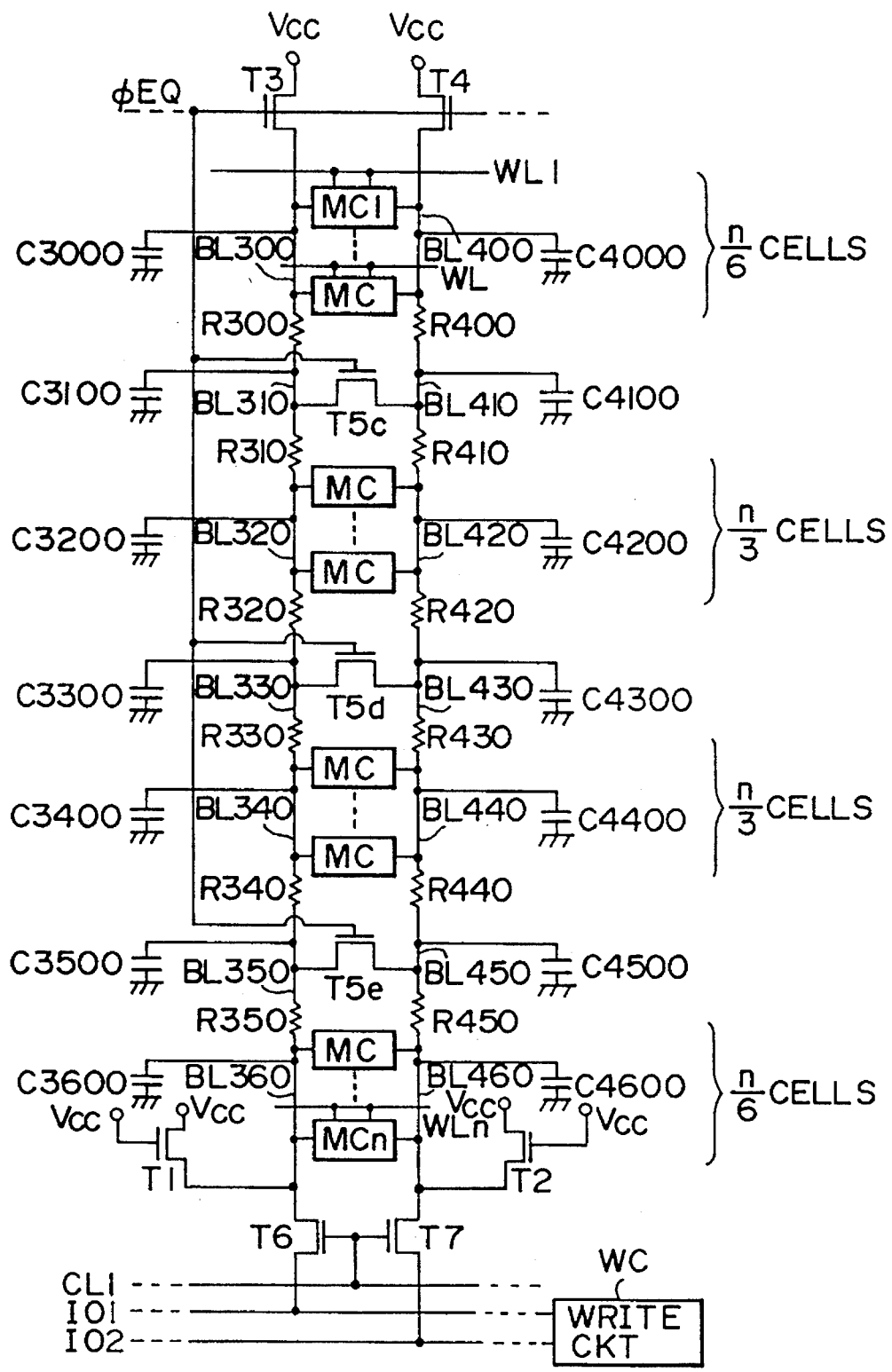
FIG. 10 is a circuit diagram showing a third embodiment of the semiconductor memory device according to the present invention.

A third embodiment of the present invention is shown in FIG. 10, in which three bit line equalize transistors T5c, T5d and T5e are arranged and connected to three difference positions. The equalize transistor T5c is connected to a position roughly one-sixth of a plurality of the memory cells arranged in the column direction, the equalize transistor T5d is connected to a position roughly half of a plurality of the memory cells arranged in the column direction, and the equalize transistor T5c is connected to a position roughly five-sixth of a plurality of the memory cells arranged in the column direction. In this embodiment, the magnitudes of the bit line resistances and the capacitances substantially connected to the equalize transistors T5c, T5d and T5e are about one-sixth of those of the prior art configuration.

In the above-mentioned second and third embodiments, the number of the equalize transistors is 2 and 3. However, it is of course possible to use 4 or more equalize transistors.

The relationship between the number of the bit line equalize transistors connected to the bit lines and the ratio in magnitude of the bit line resistance and the capacitance of the invention configuration to the prior art configuration can be expressed as a general formula as follows:

$$RBL=\tfrac{1}{2}m, CBL=\tfrac{1}{2}m$$

where m denotes the number of the equalize transistors, RBL denotes the bit line resistance, and CBL denotes the bit line capacitance. In other words, when one equalize transistor is connected to the bit lines as shown in FIG. 6, the ratio in magnitude of the bit line resistance and the bit line capacitance is ½. When two equalize transistors are connected to the bit lines as shown in FIG. 9, the ratio in magnitude of the bit line resistance and the bit line capacitance is ¼. When three equalize transistors are connected to the bit lines as shown in FIG. 10, the ratio in magnitude of the bit line resistance and the bit line capacitance is ⅙.

In the first embodiment shown in FIG. 6, the bit line equalize transistor is connected to the bit lines in such a way that the magnitudes of the bit line resistance and capacitance on the upper side of the bit line equalize transistor are equal to those on the lower side of the bit line equalize transistor when the bit lines are equalized in potential. Further, in the second and third embodiments as shown in FIGS. 9 and 10, the bit line equalize transistors are connected in such a way that the magnitudes of the bit line resistances and the capacitances substantially connected to the bit line equalize transistors are roughly equal to each other when the bit lines are equalized in potential. However, it is not necessary to connect the bit line equalize transistors to the bit lines at the positions as shown in the first to third embodiments. That is, even if the bit line equalize transistors are connected to the bit line positions as shown in FIG. 12 to 15, it is possible to obtain the same effect such that the magnitudes of the bit line resistances and the capacitances substantially connected to the bit line equalize transistors can be reduced as compared with those of the prior art configuration. In other words, when at least one bit line equalize transistor is connected to the bit lines at a position near the middle portion of a plurality of the memory cells arranged in the column direction, it is possible to obtain such an effect that the magnitudes of the bit line resistance and the capacitance substantially connected to the bit line equalize transistors can be reduced in the bit line equalization operation, as compared with the prior art configuration.

As described above, when at least one bit line equalize transistor is connected to the bit lines as with the case of the first to third embodiments, the magnitudes of the bit line resistance and the capacitance at the bit line equalization can be reduced at least half, as compared with the conventional device, thus realizing a high speed reliable bit line equalization. Further, since the bit line load transistors T1 and T2 and the bit line pull-up transistors T3 and T4 are arranged on the opposite sides respectively, it is possible to pull up the bit lines by the pull-up currents from both ends of the bit lines reliably at high speed. Further, since the bit line load transistors T1 and T2 are connected to the bit lines nearest to the input/output lines IO1 and IO2, it is possible to suppress a rise in low level voltage of the bit lines at the write operation.

As described above, in the memory device according to the present invention, at least one bit line equalizing transistor is connected to at least one position of the bit lines corresponding to the middle portion of a plurality of memory cells; the bit line load transistors are connected to the bit lines nearest to the input/output lines; and further the bit line pull-up transistors are connected to the bit lines at such positions as to be opposed to the bit line pull-up transistors. Accordingly, it is possible to execute the bit line equalization and potential pulling-up operation reliably at high speed, thus obtaining such an effect that a rise in low level voltage of the bit lines can be suppressed at the data write operation.

What is claimed is:

1. A semiconductor memory device, comprising:

a plurality of memory cells arranged substantially in a matrix pattern and each having a first input/output terminal for inputting and outputting one of complementary data and a second input/output terminal for inputting and outputting the other of the complementary data;

a plurality of word lines each for selecting said memory cells arranged in a row direction;

a plurality of pairs of bit lines each pair having first and second bit lines respectively connected to the first and second input/output terminals of said memory cells arranged in a column direction perpendicular to said row direction;

a plurality of bit line pulling-up means each connected to a first end of a pair of said bit lines, for pulling-up a potential of the pair of said bit lines;

a plurality of bit line loading means each connected to a second end of a pair of said bit lines; and a plurality of bit line equalizing means, at least one of said equalizing means being provided for each pair of said bit lines to equalize the potential of said each pair of said bit lines by allowing conduction between said each pair of said bit lines before data is read from said selected memory cell, said equalizing means being connected to said each pair of said bit lines at a position between two adjacent ones of said memory cells along the column direction for equalizing a potential of said each pair of said bit lines at each of said two adjacent memory cells.

2. The device of claim 1, which further comprises writing means connected to the second end of each of pairs of said bit lines, for writing data into said selected memory cell.

3. The device of claim 1, wherein one of said equalizing means is provided for each of the pairs of said bit lines.

4. The device of claim 2, wherein one of said equalizing means is provided for each of the pairs of said bit lines.

5. The device of claim 3, wherein said equalizing means is connected to each pair of said bit lines at predetermined positions in said matrix pattern of said memory cells.

6. The device of claim 4, wherein said equalizing means is connected to each pair of said bit lines at predetermined positions in said matrix pattern of said memory cells.

7. The device of claim 3, wherein said equalizing means is connected to each pair of said bit lines at a position where said memory cells are divided into halves.

8. The device of claim 4, wherein said equalizing means is connected to each pair of said bit lines at a position where said memory cells are divided into halves.

9. The device of claim 1, wherein m-units of said equalizing means are provided for each of the pairs of said bit lines, where m is equal to 2 or a greater integer.

10. The device of claim 2, wherein m-units of said equalizing means are provided for each of the pairs of said bit lines, where m is equal to 2 or a greater integer.

11. The device of claim 9, wherein when said memory cells connected to each of the pairs of said bit lines are divided into m-unit groups each having roughly the same number of said memory cells, said m-unit equalizing means are connected to each of the pairs of said bit lines at positions where said memory cells of each group are divided into roughly halves.

12. The device of claim 10, wherein when said memory cells connected to each of the pairs of said bit lines are divided into m-unit groups each having roughly the same number of said memory cells, said m-unit equalizing means are connected to each of the pairs of said bit lines at positions where said memory cells of each group are divided into roughly halves.

13. The device of claim 11, wherein m is 2.

14. The device of claim 12, wherein m is 2.

15. The device of claim 11, wherein m is 3.

16. The device of claim 12, wherein m is 3.

17. The device of claim 5, wherein one of said equalizing means is connected to each pair of said bit lines at a position where said memory cells in said matrix pattern are divided by a 1:3 ratio.

18. The device of claim 6, wherein one of said equalizing means is connected to each pair of said bit lines at a position where said memory cells in said matrix are divided by a 1:3 ratio.

19. The device of claim 9, wherein m is 2, and, when said memory cells are divided into first, second and third equal groups, two of said equalizing means are connected between the first and second groups and between the second and third groups, respectively.

20. The device of claim 10, wherein m is 2, and when, said memory cells are divided into first, second and third equal groups, two of said equalizing means are connected between the first and second groups and between the second and third groups, respectively.

21. The device of claim 9, wherein m is 2, and, when said memory cells are divided into first to sixth equal groups, two of said equalizing means are connected between the first and second groups and between the fifth and sixth groups, respectively.

22. The device of claim 10, wherein m is 2, and when said memory cells are divided into first to sixth equal groups, two of said equalizing means are connected between the first and second groups and between the fifth and sixth groups, respectively.

23. The device of claim 17, wherein the ratio of the number of said memory cells arranged on the side of each of said bit line pulling-up means from the position where said equalizing means is connected to said bit lines to the number of said memory cells arranged on the opposite side thereof is 1:3.

24. The device of claim 18, wherein the ratio of the number of said memory cells arranged on the side of each of said bit line pulling-up means from the position where said equalizing means is connected to said bit lines to the number of said memory cells arranged on the opposite side thereof is 1:3.

25. The device of claim 17, wherein the ratio of the number of said memory cells arranged on the side of each of said bit line pulling-up means from the position where said equalizing means is connected to said bit lines to the number of said memory cells arranged on the opposite side thereof is 3:1.

26. The device of claim 18, wherein the ratio of the number of said memory cells arranged on the side of each of said bit line pulling-up means from the position where said equalizing means is connected to said bit lines to the number of said memory cells arranged on the opposite side thereof is 3:1.

27. A semiconductor memory device, comprising a plurality of memory cells arranged in a column direction for outputting complementary data of each of the memory cells via a pair of bit lines, wherein bit line equalizing means for equalizing the pair of bit lines for at least two adjacent memory cells, prior to a data read operation, is connected between the pair of bit lines at a position between the two adjacent memory cells such that the plurality of the memory cells arranged in the column direction are divided by a predetermined ratio.

28. A semiconductor memory device, comprising:
a plurality of memory cells arranged in a column direction for outputting complementary data of each of the memory cells via a pair of bit lines, wherein a predetermined number of bit line equalizing means for equalizing the pair of the bit lines, prior to a data read operation, are connected between the pair of bit lines at positions between corresponding pairs of memory cells in the column direction such that the plurality of the memory cells arranged in the column direction are divided by a predetermined ratio and each of the bit Line equalizing means equalizes the pair of bit lines for at least its corresponding pair of memory cells.

29. A semiconductor memory device, comprising:
a plurality of memory cells arranged in a column direction for outputting complementary data of each of the memory cells via a pair of bit lines, wherein bit line equalizing means for equalizing the pair of bit lines, prior to a data read operation, is connected between the pair of bit lines at approximately a middle position of the plurality of the memory cells arranged in the column direction and equalizes the pair of bit lines at memory cells located on each. Side of the middle position.

30. A semiconductor memory device, comprising:
a plurality of memory cells arranged in m-units of groups in a column direction for outputting complementary data of each of the memory cells via a pair of bit lines, wherein m-units of bit line equalizing means for equalizing the pair of bit lines, prior to a data read operation, are connected between the pair of bit lines at approximately a middle position of each of the m-units of groups each composed of approximately the same number of the memory cells each bit line equalizing means equalizing the pair of bit lines for the memory cells in its corresponding group.

31. The semiconductor memory device of claim 27, further comprising bit line pull-up means provided at one end of the pair of bit lines, and bit line loading means provided at the other end of the pair of bit lines.

32. The semiconductor memory device of claim 28, further comprising bit line pull-up means provided at one end of the pair of bit lines, and bit line loading means provided at the other end of the pair of bit lines.

33. The semiconductor memory device of claim 29, further comprising bit line pull-up means provided at one end of the pair of bit lines, and bit line loading means provided at the other end of the pair of bit lines.

34. The semiconductor memory device of claim 30, further comprising bit line pull-up means provided at one end of the pair of bit lines, and bit line loading means provided at the other end of the pair of bit lines.

35. The semiconductor memory device of claim 27, further comprising bit line pull-up means provided at one end of the pair of bit lines, and bit line loading means connected to the other end thereof to which writing means is connected.

36. The semiconductor memory device of claim 28, further comprising bit line pull-up means provided at one end of the pair of bit lines, and bit line loading means connected to the other end thereof to which writing means is connected.

37. The semiconductor memory device of claim 29, further comprising bit line pull-up means provided at one end of the pair of bit lines, and bit line loading means connected to the other end thereof to which writing means is connected.

38. The semiconductor memory device of claim 30, further comprising bit line pull-up means provided at one end of a pair of bit lines, and bit line loading means connected to the other end thereof to which writing means is connected.

* * * * *